US009454078B2

(12) United States Patent
Onishi et al.

(10) Patent No.: US 9,454,078 B2
(45) Date of Patent: Sep. 27, 2016

(54) POSITIVE-TYPE PHOTOSENSITIVE RESIN COMPOSITION, METHOD FOR PRODUCING SEMICONDUCTOR DEVICE INCLUDING CURED FILM USING THE SAME

(71) Applicant: TORAY INDUSTRIES, INC., Tokyo (JP)

(72) Inventors: Hiroyuki Onishi, Otsu (JP); Yuki Masuda, Otsu (JP); Masao Tomikawa, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 14/422,664

(22) PCT Filed: Sep. 11, 2013

(86) PCT No.: PCT/JP2013/074523
§ 371 (c)(1),
(2) Date: Feb. 19, 2015

(87) PCT Pub. No.: WO2014/050558
PCT Pub. Date: Apr. 3, 2014

(65) Prior Publication Data
US 2015/0212412 A1 Jul. 30, 2015

(30) Foreign Application Priority Data

Sep. 25, 2012 (JP) ................. 2012-210691

(51) Int. Cl.
| | | |
|---|---|---|
| G03F 7/023 | (2006.01) |
| G03F 7/30 | (2006.01) |
| G03F 7/40 | (2006.01) |
| C08G 73/14 | (2006.01) |
| C09D 179/08 | (2006.01) |
| C08G 73/10 | (2006.01) |
| G03F 7/022 | (2006.01) |

(52) U.S. Cl.
CPC .......... *G03F 7/0233* (2013.01); *C08G 73/105* (2013.01); *C08G 73/1042* (2013.01); *C08G 73/1075* (2013.01); *C08G 73/1082* (2013.01); *C08G 73/14* (2013.01); *C09D 179/08* (2013.01); *G03F 7/0226* (2013.01); *G03F 7/40* (2013.01)

(58) Field of Classification Search
CPC ...... G03F 7/0233; G03F 7/0226; G03F 7/40; C08G 73/1042; C08G 73/105; C08G 73/1075; C08G 73/1082; C08G 73/14; C09D 179/08
USPC .......... 430/18, 191, 192, 193, 326; 528/353
See application file for complete search history.

(56) References Cited

U.S. PATENT DOCUMENTS

| | | | | |
|---|---|---|---|---|
| 6,316,109 B1* | 11/2001 | Ambrose | ............... | C08G 14/06 428/413 |
| 7,026,080 B2* | 4/2006 | Nakayama | ............ | G03F 7/0233 430/18 |
| 7,629,091 B2* | 12/2009 | Ishii | .................... | C08G 73/1039 430/18 |
| 8,071,273 B2* | 12/2011 | Sakayori | ................ | C08G 73/10 430/270.1 |
| 8,257,901 B2* | 9/2012 | Kim | ....................... | G03F 7/0233 430/192 |
| 2009/0075198 A1 | 3/2009 | Nomura | | |
| 2009/0176172 A1* | 7/2009 | Yamanaka | ............ | G03F 7/0046 430/270.1 |
| 2009/0263745 A1* | 10/2009 | Sakayori | ................ | C08G 73/10 430/281.1 |
| 2010/0258336 A1 | 10/2010 | Minegishi et al. | | |
| 2011/0046277 A1 | 2/2011 | Jo et al. | | |
| 2011/0223538 A1 | 9/2011 | Kim et al. | | |
| 2012/0244473 A1 | 9/2012 | Okuda et al. | | |
| 2013/0131282 A1* | 5/2013 | Ebara | ................. | C08G 73/1039 525/431 |

FOREIGN PATENT DOCUMENTS

| | | |
|---|---|---|
| EP | 2902846 A1 | 8/2015 |
| JP | 2004-93816 A | 3/2004 |
| JP | 2006-313237 A | 11/2006 |

(Continued)

OTHER PUBLICATIONS

International Search Report issued in PCT/JP2013/074523, dated Dec. 10, 2013.

(Continued)

*Primary Examiner* — John S Chu
(74) *Attorney, Agent, or Firm* — Birch, Stewart, Kolasch & Birch, LLP

(57) ABSTRACT

The present invention provides a positive-type photosensitive resin composition capable of obtaining a cured film which exhibits low warpage, and is also excellent in high sensitivity and high resolution during firing at a lower temperature of 250° C. or lower. Disclosed is a positive-type photosensitive resin composition including (a) a polyimide resin including a structural unit represented by the general formula (1) and a structural unit represented by the general formula (2), and (b) a quinonediazide compound, wherein the polyimide resin including a structural unit represented by the general formula (1) and a structural unit represented by the general formula (2) has an imidation ratio of 85% or more, and also a ratio of the structural unit represented by the general formula (1) to the structural unit represented by the general formula (2) is within a range of 30:70 to 90:10, in which $X_1$ in the general formula (1) represents a tetracarboxylic acid residue including 1 to 4 aromatic rings, and $Y_1$ represents an aromatic diamine residue including 1 to 4 aromatic rings, and in which $X_2$ in the general formula (2) represents a tetracarboxylic acid residue including 1 to 4 aromatic rings, and $Y_2$ represents a diamine residue including at least two or more alkylene glycol units in the main chain.

4 Claims, No Drawings

(56) References Cited

FOREIGN PATENT DOCUMENTS

| | | |
|---|---|---|
| JP | 2008-216984 A | 9/2008 |
| JP | 2008-224984 A | 9/2008 |
| JP | 4438227 A | 1/2010 |
| JP | 2010-196041 A | 9/2010 |
| JP | 2011-053366 A | 3/2011 |
| JP | 2011-53458 A | 3/2011 |
| JP | 2011-95355 A | 5/2011 |
| JP | 2011-227133 A | 11/2011 |
| JP | 2012-208360 A | 10/2012 |
| JP | 2013-3310 A | 1/2013 |
| WO | WO 2011/059089 A1 | 5/2011 |
| WO | WO 2011/111965 A2 | 9/2011 |

OTHER PUBLICATIONS

Extended European Search Report, dated Mar. 31, 2016, for European Application No. 13840268.0.

Singapore Written Opinion and Search Report, dated Feb. 5, 2016, for corresponding Singapore Application No. 11201501594U.

* cited by examiner

POSITIVE-TYPE PHOTOSENSITIVE RESIN COMPOSITION, METHOD FOR PRODUCING SEMICONDUCTOR DEVICE INCLUDING CURED FILM USING THE SAME

TECHNICAL FIELD

The present invention relates to a positive-type photosensitive resin composition, and a method for producing a semiconductor device including a cured film using the same. More particularly, the present invention relates to a positive-type photosensitive resin composition which is suitably used in a surface protective film and an interlayer dielectric film of semiconductor devices, an insulating layer of organic electroluminescence elements, and the like.

BACKGROUND ART

Heretofore, polyimide-based and polybenzoxazole-based resins having excellent heat resistance and electrical insulation properties have widely been used in a surface protective film and an interlayer dielectric film of semiconductor device, an insulating layer of organic electroluminescence elements, a flattened film of TFT substrates, and the like. When a coating film of a polyimide precursor and a polybenzoxazole precursor is thermally cyclodehydrated to obtain a thin film having excellent heat resistance and mechanical properties, firing at a high temperature of about 350° C. is usually needed.

However, due to requirements such as reduction of thermal load and achievement of low warpage for devices, there has recently been required a positive photosensitive material which is curable by firing at a low temperature of about 250° C. or lower, and more preferably 200° C. or lower, and also has high sensitivity and high resolution.

A low-temperature curable resin composition includes, for example, a photosensitive resin composition in which a ring-closed polyimide, a photo acid generator, and a heat crosslinking agent having a methylol group are used (Patent Literature 1). However, the photosensitive resin composition had a problem such as large warpage because of high elastic modulus and high shrinkability during curing.

Photosensitive resin compositions in which a polyimide or polybenzoxazole precursor including an aliphatic introduced therein and a photo acid generator are used (Patent Literatures 2 and 3) could achieve low elastic modulus, but film shrinkage due to dehydration ring closure leads to large warpage. Therefore, low warpage could not be realized even in the case of the photosensitive resin compositions in which these resins are used. Furthermore, in order to realize low warpage, there is disclosed a water-soluble photosensitive composition comprising a multi-component block copolymerization polyimide resin having an average molecular weight of 20,000 to 200,000, including a specific diamine residue and acid dianhydride residue, a photosensitizer, and water (Patent Literature 4). However, the water-soluble photosensitive composition has poor exposure sensitivity because of using a material for achieving low linear expansion property and also has restricted uses because of containing a large amount of water, and thus the composition cannot be used in a surface protective film and an interlayer dielectric film of semiconductor devices, an insulating layer of organic electroluminescence elements, and the like. Meanwhile, a negative-type photosensitive composition comprising a soluble polyimide including an aliphatic diamine introduced therein, a photopolymerizable compound, and a photopolymerization initiator has been proposed (Patent Literature 5). However, the negative-type photosensitive composition could not satisfy resolution required for use as a surface protective film of semiconductor devices.

CITATION LIST

Patent Literature

[Patent Literature 1]
  Japanese Unexamined Patent Publication (Kokai) No. 2006-313237
[Patent Literature 2]
  Japanese Unexamined Patent Publication (Kokai) No. 2008-224984
[Patent Literature 3]
  PCT International Publication No. WO 2011/059089
[Patent Literature 4]
  Japanese Patent No. 4438227
[Patent Literature 5]
  Japanese Unexamined Patent Publication (Kokai) No. 2011-95355

SUMMARY OF INVENTION

Technical Problem

An object of the present invention is to provide a positive-type photosensitive resin composition capable of obtaining a polyimide cured film which exhibits low warpage, and also has high sensitivity and high resolution during firing at a lower temperature of 250° C. or lower.

Solution To Problem

In order to achieve the above object, the resin composition of the present invention consists of the following constituents. Namely, the positive-type photosensitive resin composition includes (a) a polyimide resin including a structural unit represented by the general formula (1) and a structural unit represented by the general formula (2), and (b) a quinonediazide compound, wherein the polyimide resin (a) including a structural unit represented by the general formula (1) and a structural unit represented by the general formula (2) has an imidization ratio of 85% or more, and also a ratio of the structural unit represented by the general formula (1) to the structural unit represented by the general formula (2) is within a range of 30:70 to 90:10:

[Chemical Formula 1]

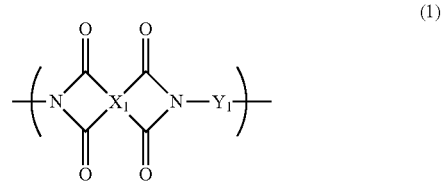

wherein $X_1$ in the general formula (1) represents a tetracarboxylic acid residue including 1 to 4 aromatic rings, and $Y_1$ represents an aromatic diamine residue including 1 to 4 aromatic rings; and

[Chemical Formula 2]

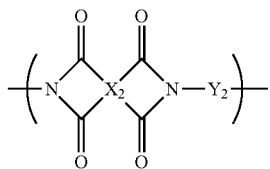

(2)

wherein $X_2$ in the general formula (2) represents a tetracarboxylic acid residue including 1 to 4 aromatic rings, and $Y_2$ represents a diamine residue including at least two or more alkylene glycol units in the main chain.

Advantageous Effects of Invention

The present invention provides a positive-type photosensitive resin composition capable of obtaining a cured film which exhibits low warpage, and also has high sensitivity and high resolution during firing at a lower temperature of 250° C. or lower.

DESCRIPTION OF EMBODIMENTS

The resin composition of the present invention is a positive-type photosensitive resin composition including (a) a polyimide resin including a structural unit represented by the general formula (1) and a structural unit represented by the general formula (2), and (b) a quinonediazide compound, wherein the polyimide resin (a) including a structural unit represented by the general formula (1) and a structural unit represented by the general formula (2) has an imidation ratio of 85% or more, and also a ratio of the structural unit represented by the general formula (1) to the structural unit represented by the general formula (2) is within a range of 30:70 to 90:10:

[Chemical Formula 3]

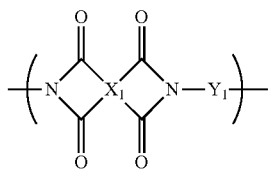

(1)

wherein $X_1$ in the general formula (1) represents a tetracarboxylic acid residue including 1 to 4 aromatic rings, and $Y_1$ represents an aromatic diamine residue including 1 to 4 aromatic rings; and

[Chemical Formula 4]

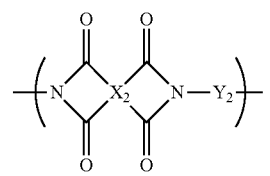

(2)

wherein $X_2$ in the general formula (2) represents a tetracarboxylic acid residue including 1 to 4 aromatic rings, and $Y_2$ represents a diamine residue including at least two or more alkylene glycol units in the main chain.

The polyimide resin (a) of the present invention includes a structural unit represented by the general formula (1). In the present invention, $Y_1$ represents an aromatic diamine residue including 1 to 4 aromatic rings, and examples of preferred diamine including $Y_1$ include hydroxyl group-containing diamines such as bis(3-amino-4-hydroxyphenyl)hexafluoropropane, bis(3-amino-4-hydroxyphenyl)sulfone, bis(3-amino-4-hydroxyphenyl)propane, bis(3-amino-4-hydroxyphenyl)methylene, bis(3-amino-4-hydroxyphenyl)ether, bis(3-amino-4-hydroxy)biphenyl, and bis(3-amino-4-hydroxyphenyl)fluorene; sulfonic acid-containing diamines such as 3-sulfonic acid-4,4'-diaminodiphenylether; thiol group-containing diamines such as dimercaptophenylenediamine; aromatic diamines such as 3,4'-diaminodiphenylether, 4,4'-diaminodiphenylether, 3,4'-diaminodiphenylmethane, 4,4'-diaminodiphenylmethane, 3,4'-diaminodiphenylsulfone, 4,4'-diaminodiphenylsulfone, 3,4'-diaminodiphenyl sulfide, 4,4'-diaminodiphenyl sulfide, 1,4-bis(4-aminophenoxy)benzene, benzidine, m-phenylenediamine, p-phenylenediamine, bis(4-aminophenoxyphenyl)sulfone, bis(3-aminophenoxyphenyl)sulfone, bis(4-aminophenoxy)biphenyl, bis{4-(4-aminophenoxyl)phenyl}ether, 1,4-bis(4-aminophenoxy)benzene, 2,2'-dimethyl-4,4'-diaminobiphenyl, 2,2'-diethyl-4,4'-diaminobiphenyl, 3,3'-dimethyl-4,4'-diaminobiphenyl, 3,3'-diethyl-4,4'-diaminobiphenyl, 2,2',3,3'-tetramethyl-4,4'-diaminobiphenyl, 3,3',4,4'-tetramethyl-4,4'-diaminobiphenyl, and 2,2'-bis(trifluoromethyl)-4,4'-diaminobiphenyl; and compounds in which hydrogen atoms of the aromatic ring thereof are partially substituted with an alkyl group having 1 to 10 carbon atoms, a fluoroalkyl group, a halogen atom, and the like. These diamines can be used as they are, or used as corresponding diisocyanate compounds or trimethylsilylated diamines. Two or more diamine components may be used in combination.

The polyimide resin (a) of the present invention also includes a structural unit represented by the general formula (2).

In the present invention, $Y_2$ represents a diamine residue including at least two or more alkylene glycol units in the main chain. The diamine residue is preferably a diamine residue including two or more of one or both of an ethylene glycol chain and a propylene glycol chain in total in a molecule, and more preferably a diamine residue having a structure including no aromatic ring.

Examples of the diamine including an ethylene glycol chain and a propylene glycol chain include, but are not limited to, JEFFAMINE (registered trademark) KH-511, JEFFAMINE ED-600, JEFFAMINE ED-900, and JEFFAMINE ED-2003; and examples of the diamine including an ethylene glycol chain include, but are not limited to, JEFFAMINE EDR-148 and JEFFAMINE EDR-176 (which are trade names, manufactured by HUNTSMAN Corporation).

In the polyimide resin (a), $X_1$ in the general formula (1) represents a tetracarboxylic acid residue including 1 to 4 aromatic rings. $X_2$ in the general formula (2) represents a tetracarboxylic acid residue including 1 to 4 aromatic rings. $X_1$ and $X_2$ may be the same or different. Examples of preferred tetracarboxylic acid including them include aromatic tetracarboxylic acids such as pyromellitic acid, 3,3',4,4'-biphenyltetracarboxylic acid, 2,3,3',4'-biphenyltetracarboxylic acid, 2,2',3,3'-biphenyltetracarboxylic acid, 3,3',4,4'-benzophenonetetracarboxylic acid, 2,2',3,3'- benzophenonetetracarboxylic acid, 2,2-bis(3,4-dicarboxyphenyl)hexafluoropropane, 2,2-bis(2,3-dicarboxyphenyl)hexafluoropropane, 1,1-bis(3,4-dicarboxyphenyl)ethane, 1,1-bis(2,3-dicarboxyphenyl)ethane, bis(3,4-dicarboxyphenyl)methane, bis(2,3-dicarboxyphenyl)methane, bis(3,4-dicarboxyphenyl)sulfone, bis(3,4-dicarboxyphenyl)ether, 1,2,5,6-naphthalenetetracarboxylic acid, 2,3,6,7-naphthalenetetracarboxylic acid, 2,3,5,6-pyridinetetracarboxylic acid, and 3,4,9,10-perylenetetracarboxylic acid; and structures in which one to four hydrogen atoms thereof are partially substituted with an alkyl group having 1 to 20 carbon atoms, a fluoroalkyl group, an alkoxyl group, an ester group, a nitro group, a cyano group, a fluorine atom, and a chlorine atom.

The polyimide resin (a) of the present invention can be obtained by reacting tetracarboxylic dianhydride serving as a tetracarboxylic acid residue represented by the above-mentioned $X_1$ and $X_2$ with diamine serving as a diamine residue represented by the above-mentioned $Y_1$ and $Y_2$ to obtain a polyamic acid, and allowing the polyamic acid to undergo dehydration ring closure by a heating treatment, or a chemical treatment with an acid or a base.

The polyimide resin (a) of the present invention is characterized in that an imidization ratio is 85% or more, and preferably 90% or more. When the imidization ratio is 85% or more, film shrinkage due to dehydration ring closure, which occurs when imidization is performed by heating, decreases and also the occurrence of warpage can be suppressed.

The polyimide resin (a) used in the present invention may be composed of only structural units of the general formula (1) and the general formula (2), or may be a copolymer or mixture with other structural units. A ratio of the structural unit represented by the general formula (1) to the structural unit represented by the general formula (2) is within a range of 30:70 to 90:10. The ratio is preferably adjusted within a range of 50:50 to 90:10 since excellent developability is achieved, and more preferably 60:40 to 80:20 since more excellent developability as well as high sensitivity and high resolution are achieved. The structural unit represented by the general formula (1) and the structural unit represented by the general formula (2) preferably accounts for 50% by weight or more, and more preferably 70% by weight or more, of the whole resin.

The polyimide resin (a) of the present invention preferably includes a fluorine atom in the structural unit. The fluorine atom imparts water repellency to a surface of a film during alkali development, thus enabling suppression of permeation from the surface. The content of the fluorine atom in the component of the polyimide resin (a) is preferably 10% by weight or more, and preferably 20% by weight or less in view of solubility in an aqueous alkali solution.

For the purpose of improving adhesion to a substrate, an aliphatic group including a siloxane structure may be copolymerized. Specific examples of the diamine component include bis(3-aminopropyl)tetramethyldisiloxane, bis(p-aminophenyl)octamethylpentasiloxane, and the like.

In order to improve storage stability of the resin composition, the main chain terminal of the polyimide resin (a) is preferably blocked with a terminal blocking agent such as a monoamine, an acid anhydride, a monocarboxylic acid, a mono acid chloride compound, or a monoactive ester compound. Of these diamine components, a monoamine is more preferably used. Examples of preferred compound of the monoamine include aniline, 2-ethynylaniline, 3-ethynylaniline, 4-ethynylaniline, 5-amino-8-hydroxyquinoline, 1-hydroxy-7-aminonaphthalene, 1-hydroxy-6-aminonaphthalene, 1-hydroxy-5-aminonaphthalene, 1-hydroxy-4-aminonaphthalene, 2-hydroxy-7-aminonaphthalene, 2-hydroxy-6-aminonaphthalene, 2-hydroxy-5-aminonaphthalene, 1-carboxy-7-aminonaphthalene, 1-carboxy-6-aminonaphthalene, 1-carboxy-5-aminonaphthalene, 2-carboxy-7-aminonaphthalene, 2-carboxy-6-aminonaphthalene, 2-carboxy-5-aminonaphthalene, 2-aminobenzoic acid, 3-aminobenzoic acid, 4-aminobenzoic acid, 4-aminosalicylic acid, 5-aminosalicylic acid, 6-aminosalicylic acid, 2-aminobenzenesulfonic acid, 3-aminobenzenesulfonic acid, 4-aminobenzenesulfonic acid, 3-amino-4,6-dihydroxypyrimidine, 2-aminophenol, 3-aminophenol, 4-aminophenol, 2-aminothiophenol, 3-aminothiophenol, 4-aminothiophenol, and the like. Two or more of these monoamines may be used, or a plurality of different terminal group may be introduced by reacting a plurality of terminal blocking agents.

Regarding the polyimide resin (a) of the present invention, the diamine residue including at least two or more alkylene glycol units in the main chain represented by $Y_2$ in the general formula (2) is preferably a diamine residue having a structure represented by the general formula (3). The existence of the diamine residue having a structure represented by the general formula (3) leads to low elastic modulus and small warpage. It is preferable that elongation is improved and also heat resistance is excellent because of the structure having high flexibility.

[Chemical Formula 5]

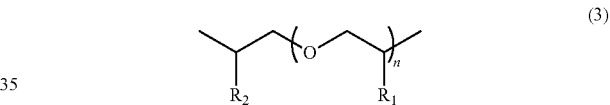

(3)

In the general formula (3), $R_1$ and $R_2$ represent a hydrogen atom or an alkyl group having 1 to 20 carbon atoms, a plurality of $R_1$(s) in the same residue may be the same or different, and n represents an integer of 2 to 50.

The positive-type photosensitive resin composition of the present invention contains a quinonediazide compound (b).

The quinonediazide compound (b) include those with sulfonic acid of quinonediazide ester-bonded to a polyhydroxy compound, those with sulfonic acid of quinonediazide sulfoneamide-bonded to a polyamino compound, and those with sulfonic acid of quinonediazide ester-bonded and/or sulfoneamide-bonded to a polyhydroxypolyamino compound. By using such a quinonediazide compound, a positive-type photosensitive resin composition which is photosensitive to i-line (wavelength of 365 nm), h-line (wavelength of 405 nm), and g-line (wavelength of 436 nm) of a mercury lamp, which are common ultraviolet rays, can be obtained. All functional groups of these polyhydroxy compound, polyamino compound, and polyhydroxypolyamino compound may not be substituted with quinonediazide, but two or more functional groups per molecule are preferably substituted with quinonediazide. Such a quinonediazide compound is crosslinked with a polyimide resin (a) at a comparatively low temperature within a range from 120° C. to 140° C. Since this reaction causes decomposition at about 180° C., the reaction does not serve as a thermally crosslinkable compound (c) for easily obtaining a cured film. This reaction enables suppression of collapse of a pattern shape when using in combination with the thermally crosslinkable compound (c) having a comparatively high reaction initiation temperature of about 180° C., followed by formation of a pattern and further heating treatment at 200° C. or higher.

Examples of the polyhydroxy compound include, but are not limited to, Bis-Z, BisP-EZ, TekP-4HBPA, TrisP-HAP, TrisP-PA, TrisP-SA, TrisOCR-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X, DML-MBPC, DML-MBOC, DML-OCHP, DML-PCHP, DML-PC, DML-PTBP, DML-34X, DML-EP, DML-POP, dimethylol-BisOC-P, DML-PFP, DML-PSBP, DML-MTrisPC, TriML-P, TriML-35XL, TML-BP, TML-HQ, TML-pp-BPF, TML-BPA, TMOM-BP, HML-TPPHBA, HML-TPHAP (which are trade names, manufactured by Honshu Chemical Industry Co., Ltd.), BIR-OC, BIP-PC, BIR-PC, BIR-PTBP, BIR-PCHP, BIP-BIOC-F, 4PC, BIR-BIPC-F, TEP-BIP-A, 46DMOC, 46DMOEP, TM-BIP-A (which are trade names, manufactured by ASAHI ORGANIC CHEMICALS INDUSTRY CO., LTD.), 2,6-dimethoxymethyl-4-t-butylphenol, 2,6-dimethoxymethyl-p-cresol, 2,6-diacetoxymethyl-p-cresol, naphthol, tetrahydroxybenzophenone, gallic acid methyl ester, bisphenol A, bisphenol E, methylenebisphenol, BisP-AP (trade name, manufactured by Honshu Chemical Industry Co., Ltd.), novolak resin, and the like.

Examples of the polyamino compound include, but are not limited to, 1,4-phenylenediamine, 1,3-phenylenediamine, 4,4'-diaminodiphenylether, 4,4'-diaminodiphenylmethane, 4,4'-diaminodiphenylsulfone, 4,4'-diaminodiphenyl sulfide, and the like.

Examples of the polyhydroxypolyamino compound include, but are not limited to, 2,2-bis(3-amino-4-hydroxyphenyl)hexafluoropropane, 3,3'-dihydroxybenzidine, and the like.

In the present invention, both a 5-naphthoquinonediazidesulfonyl group and a 4-naphthoquinonediazidesulfonyl group are preferably used in quinonediazide. In the present invention, it is also possible to obtain a naphthoquinonediazidesulfonyl ester compound in which a 4-naphthoquinonediazidesulfonyl group and a 5-naphthoquinonediazidesulfonyl group are used in combination in the same molecule, and it is also possible to use a 4-naphthoquinonediazidesulfonyl ester compound and a 5-naphthoquinonediazidesulfonyl ester compound as a mixture.

It is more preferred that, of these, the quinonediazide compound (b) contains an ester of a phenol compound and a 5-naphthoquinonediazidesulfonyl group. Thus, high sensitivity can be obtained by i-line exposure.

The content of the quinonediazide compound (b) is preferably within a range of 1 to 50 parts by weight, and more preferably 10 to 40 parts by weight, based on 100 parts by weight of the resin as the component (a). An attempt can be made to achieve higher sensitivity by adjusting the content of the quinonediazide compound within the above range. Furthermore, a sensitizer may be optionally added.

The positive-type photosensitive resin composition of the present invention may contain (c) a thermally crosslinkable compound for the purpose of easily obtaining a cured film. Examples of the thermally crosslinkable compound (c) include a compound having a benzoxazine structure, a compound having an epoxy structure, a compound having an oxetane structure, and a compound having an alkoxymethyl group, and these thermally crosslinkable compounds can also be used as a mixture. Among these, a compound having a benzoxazine structure is preferable since degassing due to curing does not occur because of the crosliking reaction due to the ring-opening addition reaction, and also the occurrence of warpage is suppressed because of small shrinkage due to heat.

Preferred examples of the compound having a benzoxazine structure include B-a type benzoxazine, B-m type benzoxazine (which are trade names, manufactured by SHIKOKU CHEMICALS CORPORATION), a benzoxazine adduct of a polyhydroxystyrene resin, a phenol novolak type dihydrobenzoxazine compound, and the like. These compounds may be used alone, or two or more of compounds may be mixed.

Preferred examples of the compound having an epoxy structure include EPICLON (registered trademark) 850-S, EPICLON HP-4032, EPICLON HP-7200, EPICLON HP-820, EPICLON HP-4700, EPICLON EXA-4710, EPICLON HP-4770, EPICLON EXA-859CRP, EPICLON EXA-4880, EPICLON EXA-4850, EPICLON EXA-4816, EPICLON EXA-4822 (which are trade names, manufactured by Dainippon Ink and Chemicals, Inc.), RIKARESIN (registered trademark) BPO-20E, RIKARESINBEO-60E (which are trade names, manufactured by New Japan Chemical Co., Ltd.), EP-4003S, EP-4000S (which are trade names, manufactured by ADEKA CORPORATION), and the like. These compounds may be used alone, or two or more of compounds may be mixed.

Examples of the compound having an oxetane structure include a compound having two or more oxetane rings in a molecule, 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, 1,4-benzenedicarboxylic acid-bis[(3-ethyl-3-oxetanyl)methyl]ester, and the like. Specifically, ARON OXETANE Series manufactured by TOAGOSEI CO., LTD. can be suitably used, and these compounds may be used alone, or two or more of compounds may be mixed.

Preferred examples of the compound having an alkoxymethyl group include DML-PC, DML-PEP, DML-OC, DML-OEP, DML-34X, DML-PTBP, DML-PCHP, DML-OCHP, DML-PFP, DML-PSBP, DML-POP, DML-MBOC, DML-MBPC, DML-MTrisPC, DML-BisOC-Z, DML-BisOCHP-Z, DML-BPC, DML-BisOC-P, DMOM-PC, DMOM-PTBP, DMOM-MBPC, TriML-P, TriML-35XL, TML-HQ, TML-BP, TML-pp-BPF, TML-BPE, TML-BPA, TML-BPAF, TML-BPAP, TMOM-BP, TMOM-BPE, TMOM-BPA, TMOM-BPAF, TMOM-BPAP, HML-TPPHBA, HML-TPHAP, HMOM-TPPHBA, HMOM-TPHAP (which are trade names, manufactured by Honshu Chemical Industry Co., Ltd.), NIKALAC (registered trademark) MX-290, and NIKALAC MX-280, NIKALAC MX-270, NIKALAC MX-279, NIKALAC NW-100LM, NIKALAC MX-750LM (which are trade names, manufactured by Sanwa Chemical Co., Ltd.). These compounds may be used alone, or two or more of compounds may be mixed.

The positive-type photosensitive resin composition of the present invention may optionally contain surfactants; esters such as ethyl lactate and propylene glycol monomethyl ether acetate; alcohols such as ethanol; ketones such as cyclohexanone and methyl isobutyl ketone; and ethers such as tetrahydrofuran and dioxane, for the purpose of improving wettability with a substrate.

The positive-type photosensitive resin composition of the present invention may contain inorganic particles. Preferred specific examples include, but are not limited to, silicon oxide, titanium oxide, barium titanate, alumina, talc, and the like. These inorganic particles preferably have a primary particle diameter of 100 nm or less, and more preferably 60 nm or less.

In order to enhance adhesion to the substrate, the positive-type photosensitive resin composition of the present invention may contain, as a silicone component, silane coupling agents such as trimethoxyaminopropylsilane, trimethoxyepoxysilane, trimethoxyvinylsilane, and trimethoxythiolpropylsilane, as long as storage stability does not deteriorate. The content of the silane coupling agent is preferably within a range of 0.01 to 5 parts by weight based on 100 parts by weight of the component (a).

The positive-type photosensitive resin composition may optionally contain a compound having a phenolic hydroxyl group as long as a shrinkage residual film rate after curing is not decreased. Inclusion of these compounds enables adjustment of a developing time, thus improving scum. Examples of the compound having a phenolic hydroxyl group include Bis-Z, BisP-EZ, TekP-4HBPA, TrisP-HAP, TrisP-PA, BisOCHP-Z, BisP-MZ, BisP-PZ, BisP-IPZ, BisOCP-IPZ, BisP-CP, BisRS-2P, BisRS-3P, BisP-OCHP, methylenetris-FR-CR, BisRS-26X (which are trade names, manufactured by Honshu Chemical Industry Co., Ltd.), BIP-PC, BIR-PC, BIR-PTBP, BIR-BIPC-F (which are trade names, manufactured by ASAHI ORGANIC CHEMICALS INDUSTRY CO., LTD.), novolak resin, and the like. Two or more of these compounds may be contained.

The positive-type photosensitive resin composition of the present invention preferably contains a solvent. Thus, the positive-type photosensitive resin composition can be put into a state of a varnish, thus improving coatability.

It is possible to use solvents, for example, polar aprotic solvents such as γ-butyrolactone; ethers such as ethylene glycol monomethyl ether, ethylene glycol monoethyl ether, ethylene glycol mono-n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, tripropylene glycol monoethyl ether, tetrahydrofuran, and dioxane; ketones such as acetone, methyl ethyl ketone, diisobutyl ketone, cyclohexanone, 2-heptanone, 3-heptanone, and diacetone alcohol; esters such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, propylene glycol monoethyl ether acetate, and ethyl lactate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-phenylbutanoate, 3-methoxybutyl acetate, 3-methyl-3-methoxybutyl acetate, 3-methyl-3-methoxybutylpropionate, ethyl acetate, n-propyl acetate, i-propyl acetate, n-butyl acetate, i-butyl acetate, n-pentyl formate, i-pentyl acetate, n-butyl propionate, ethyl butyrate, n-propyl butyrate, i-propyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; and amides such as N-methylpyrrolidone, N,N-dimethylformamide, and N,N-dimethylacetamide; alone or to use as a mixture. Of these solvents, γ-butyrolactone is preferable since it can satisfactory dissolve other components to form a coating film having satisfactory smoothness.

The amount of the solvent to be used is not particularly limited and is preferably within a range of 50 to 2,000 parts by weight, and particularly preferably 100 to 1,500 parts by weight, based on 100 parts by weight of the resin as the component (a).

A description will be made of a method for forming a heat-resistant resin pattern using the positive-type photosensitive resin composition of the present invention.

First, the positive-type photosensitive resin composition of the present invention is applied on a substrate. Examples of the substrate to be commonly used include, but are not limited to, a silicon wafer, ceramics, gallium arsenide, metal, glass, metal oxide insulating film, silicon nitride, ITO, and the like. The coating method capable of imparting satisfactory in-plane uniformity includes a spin coating method using a spinner, a slit coating method, a method of spin coating after slit coating, a spray coating method, and the like. Although the thickness of a coating film varies depending on the coating technique, the viscosity and solid content of the composition, and the like, the composition is usually applied so that the film thickness after drying becomes 0.1 to 150 μm.

Next, the substrate coated with the positive-type photosensitive resin composition is dried to obtain a positive-type photosensitive resin composition coating film. Drying is preferably performed at a temperature within a range of 50° C. to 150° C. for one minute to several hours, using an oven, a hot plate, infrared rays, and the like.

This resin film is exposed by irradiation with actinic rays through a mask having a desired pattern. Examples of actinic rays used for exposure include ultraviolet rays, visible rays, electron beams, X-rays. In the present invention, actinic rays selected from i-line (wavelength of 365 nm), h-line (wavelength of 405 nm), and g-line (wavelength of 436 nm) from a mercury lamp are preferably used.

After the exposure, the exposed area is removed using a developing solution. The developing solution is preferably an aqueous alkali solution of compounds exhibiting alkalinity, such as tetramethylammonium, diethanolamine, diethylaminoethanol, sodium hydroxide, potassium hydroxide, sodium carbonate, potassium carbonate, triethylamine, diethylamine, methylamine, dimethylamine, dimethylaminoethyl acetate, dimethylaminoethanol, dimethylaminoethyl methacrylate, cyclohexylamine, ethylenediamine, and hexamethylenediamine. In some cases, to these aqueous alkali solutions, polar solvents such as N-methyl-2-pyrrolidone, N,N-dimethylformamide, N,N-dimethylacetamide, dimethyl sulfoxide, γ-butyrolactone, and dimethylacrylamide; alcohols such as methanol, ethanol, and isopropanol; esters such as ethyl lactate and propylene glycol monomethyl ether acetate; and ketones such as cyclopentanone, cyclohexanone, isobutyl ketone, and methyl isobutyl ketone may be added alone or in combination of several kinds thereof. After the development, a rinsing treatment is preferably performed using water. Here, the rinsing treatment may also be performed using alcohols such as ethanol and isopropyl alcohol, esters such as ethyl lactate and propylene glycol monomethyl ether acetate, and the like added to water.

After the development, the film is converted into a heat-resistant resin coating film by heating at a temperature within a range of 100° C. to 400° C. This heating treatment is carried out for 5 minutes to 5 hours such that the temperature is selected and the temperature is elevated stepwise, or a certain temperature range is selected and the temperature is continuously elevated. As one example, a heat treatment is performed at 100° C., 150° C., and 250° C. for 60 minutes, respectively, or a heat treatment is performed by linearly elevating the temperature from room temperature to 250° C. over hours.

Next, a description is made of a cured film formed from the positive-type photosensitive resin composition of the present invention. The heat resistance resin coating film formed from the positive-type photosensitive resin composition of the present invention is used, as a cured film, for passivation films of semiconductors, surface protective films in which a cured film of the positive-type photosensitive resin composition is formed on passivation films, interlayer dielectric films formed on circuits of semiconductor devices, insulating layers of organic electroluminescence elements, and the like.

The cured film formed from the positive-type photosensitive resin composition of the present invention is a cured film which exhibits low warpage, and also has high sensitivity and high resolution.

EXAMPLES

The present invention will be described below by way of Examples, but the present invention is not limited by these Examples.

First, evaluation procedures in the respective Examples and Comparative Examples will be described. A positive-type photosensitive resin composition (hereinafter referred to as a varnish) filtered through a 1 μm thick filter made of polytetrafluoroethylene (manufactured by Sumitomo Electric Industries, Ltd.) in advance was used for evaluation.

(1) Measurement of Imidization Ratio of Polyimide Resin

A solution prepared by dissolving a polyimide resin in N-methylpyrrolidone (NMP) in a solid component concentration of 50% by weight was applied on a 6 inch silicon wafer by a spin coating method, and then baked by a hot plate (SKW-636, manufactured by DAINIPPON SCREEN MFG. CO., LTD.) at 120° C. for 3 minutes to form a prebaked film having a thickness of 10 μm±1 μm. This film was divided into halves and one half was introduced in an inert oven (INH-21CD, manufactured by Koyo Thermo Systems Co., Ltd.). The temperature was raised to the curing temperature of 350° C. over 30 minutes and then a heating treatment was performed at 350° C. for 60 minutes. After slowly cooling until the temperature in the oven reaches 50° C. or lower, a cured film (hereinafter referred to as a "cured film") was obtained. With respect to the obtained cured film (A) and the film (B) before curing, an infrared absorption spectrum was measured using a Fourier transform infrared spectrophotometer FT-720 (manufactured by HORIBA, Ltd.). A peak intensity at about 1,377 cm$^{-1}$ due to C-N stretching vibration of an imide ring was determined, and a ratio of peak intensity of a cured film (A)/peak intensity of a film (B) before curing was regarded as an imidization ratio.

(2) Evaluation of Sensitivity

Using a coating and developing system ACT-8 (manufactured by Tokyo Electron Limited), application of a varnish on an 8 inch silicon wafer and prebaking at 120° C. for 3 minutes were performed by a spin coating method. Using an exposure device i-line stepper NSR-2005i9C (manufactured by Nikon Corporation), exposure was performed. After the exposure, using a developing device ACT-8, development with an aqueous 2.38% by weight tetramethylammonium solution (hereinafter referred to as TMAH, manufactured by Tama Chemicals Co., Ltd.) was repeated twice by a paddle method (ejection time of a developing solution of 10 seconds and a paddle time of 40 seconds), followed by rinsing with pure water and further draining and drying. Minimum light exposure when the exposed area is completely dissolved was regarded as sensitivity. The case where sensitivity is 500 mJ/cm$^2$ or more was rated (C) (poor), the case where sensitivity is 300 mJ/cm$^2$ or more and less than 500 mJ/cm$^2$ was rated (B) (satisfactory), and the case where sensitivity is less than 300 mJ/cm$^2$ was rated (A) (more satisfactory).

(3) Evaluation of Resolution

Using a coating and developing system ACT-8 (manufactured by Tokyo Electron Limited), application of a varnish on an 8 inch silicon wafer and prebaking at 120° C. for 3 minutes were performed by a spin coating method. A reticle with a cut-off pattern was set in an exposure device an exposure device i-line stepper NSR-2005i9C (manufactured by Nikon Corporation) and the coating film was exposed at an exposure dose of 800 mJ/cm$^2$. After the exposure, using a developing device ACT-8, development with an aqueous 2.38% by weight tetramethylammonium solution (hereinafter referred to as TMAH, manufactured by Tama Chemicals Co., Ltd.) was repeated twice by a paddle method (ejection time of a developing solution of 10 seconds and a paddle time of 40 seconds), followed by rinsing with pure water and further draining and drying to obtain a positive type pattern. Using an inert oven CLH-21CD-S (manufactured by Koyo Thermo Systems Co., Ltd.), the temperature was raised to 200° C. at 3.5° C./minute in the oxygen concentration 20 ppm or less, and a heating treatment was performed at 200° C. for one hour. Upon reaching the temperature of 50° C. or lower, the wafer was taken out and the pattern was observed by a microscope. As a result, minimum dimension resolved by line-and-space was regarded as resolution. The case where resolution is 10 μm or more was rated (C) (poor), the case where resolution is 5 μm or more and less than 10 μm was rated (B) (satisfactory), and the case where resolution is less than 5 μm was rated (A) (more satisfactory).

(4) Measurement of Warpage

Using a coating and developing system ACT-8, application of a varnish and prebaking at 120° C. for 3 minutes were performed by a spin coating method so that the film thickness after prebaking became 10 μm. Using an inert oven CLH-21CD-S (manufactured by Kayo Thermo Systems Co., Ltd.), the temperature was raised to 200° C. at 3.5° C./minute in the oxygen concentration 20 ppm or less, and a heating treatment was performed at 200° C. for one hour. Upon reaching the temperature of 50° C. or lower, the wafer was taken out and the cured film was measured using a stress measurement system FLX2908 (manufactured by KLA-Tencor Corporation). The case where stress is 35 MPa or more was rated (D) (poor), the case where stress is 30 MPa or more and less than 35 MPa was rated (C) (satisfactory), the case where stress is 20 MPa or more and less than 30 MPa was rated (B) (more satisfactory), and the case where stress is less than 20 MPa was rated (A) (extremely satisfactory).

Synthesis Example 1

Synthesis of Quinonediazide Compound (B)

Under a current of dry nitrogen, 21.22 g (0.05 mol) of TrisP-PA (trade name, manufactured by Honshu Chemical Industry Co., Ltd.) and 26.8 g (0.1 mol) of 5-naphthoquinonediazidesulfonic acid chloride (NAC-5, manufactured by Toyo Gosei Co., Ltd.) were dissolved in 450 g of 1,4-dioxane, followed by returning to room temperature. To the solution, a mixture of 50 g of 1,4-dioxane and 12.65 g of triethylamine was added dropwise so that the temperature in the system does not reach 35° C. or higher. After dropwise addition, the mixture was stirred at 40° C. for 2 hours. A triethylamine salt was filtered off and the filtrate was poured into water. Thereafter, the precipitate thus formed was collected by filtration and washedwith 1 L of aqueous 1% hydrochloric acid. Thereafter, the precipitate was further washed twice with 2 L of water. This precipitate was dried by a vacuum dryer to obtain a quinonediazide compound (B) represented by the following formula.

[Chemical Formula 6]

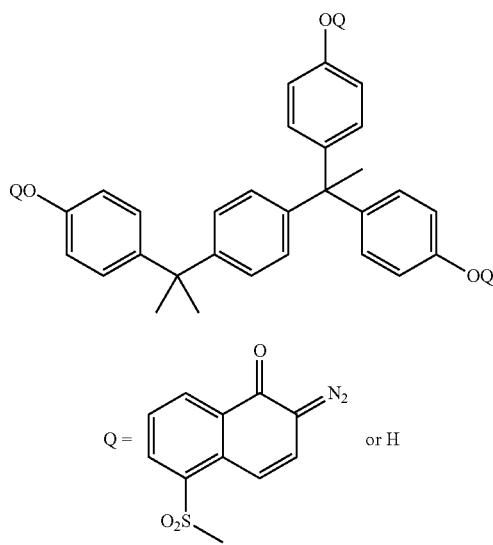

Synthesis Example 2

Synthesis of Resin (A-1)

Under a current of dry nitrogen, 62.0 g (0.2 mol) of 3,3',4,4'-diphenylethertetracarboxylic dianhydride (hereinafter referred to as ODPA) was dissolved in 1,000 g of N-methylpyrrolidone (hereinafter referred to as NMP). To the solution, 47.5 g (0.13 mol) of 2,2-bis(3-amino-4-hydroxyphenyl)hexafluoropropane (hereinafter referred to as BAHF), 14.0 g (0.06 mol) of 1-(2-(2-(2-aminopropoxy)ethoxy)propoxy)propane-2-amine which is diamine of ethylene glycol and a propylene glycol framework, and 2.5 g (0.01 mol) of 1,3-bis(3-aminopropyl)tetramethyldisiloxane were added together with 250 g of NMP, followed by a reaction at 60° C. for one hour and further reaction at 200° C. for 6 hours. After completion of the reaction, the solution was cooled to room temperature and the solution was poured into 10 L of water to obtain a white precipitate. This precipitate was collected by filtration, washed three times with water, and then dried by a vacuum dryer at 80° C. for 40 hours to obtain a copolymer (A-1) of polyimide as the objective resin. A ratio of a structural unit represented by the general formula (1) to a structural unit represented by the general formula (2) was 68:32, and an imidization ratio was 96%.

Synthesis Example 3

Synthesis of Resin (A-2)

Under a current of dry nitrogen, 62.0 g (0.2 mol) of ODPA was dissolved in 1,000 g of NMP. To the solution, 40.2 g (0.11 mol) of BAHE and 17.4 g (0.07 mol) of 1-(1-(1-(2-aminopropoxyl)propan-2-yl)oxy)propane-2-amine which is diamine of a propylene glycol framework were added together with 200 g of NMP, and then 4.4 g (0.04 mol) of 3-aminophenol as a terminal blocking agent was added together with 50 g of NMP, followed by a reaction at 60° C. for one hour and further reaction at 180° C. for 6 hours. After completion of the reaction, the solution was cooled to room temperature and the solution was poured into 10 L of water to obtain a white precipitate. This precipitate was collected by filtration, washed three times with water, and then dried by a vacuum dryer at 80° C. for 40 hours to obtain a copolymer (A-2) of polyimide as the objective resin. A ratio of a structural unit represented by the general formula (1) to a structural unit represented by the general formula (2) was 61:39, and an imidization ratio was 91%.

Synthesis Example 4

Synthesis of Resin (A-3)

Under a current of dry nitrogen, 62.0 g (0.2 mol) of ODPA was dissolved in 1,000 g of NMP. To the solution, 47.5 g (0.13 mol) of BAHF, 14.0 g (0.06 mol) of 1-(2-(2-(2-aminopropoxyl)ethoxy)propoxy)propane-2-amine, and 2.5 g (0.01 mol) of 1,3-bis(3-aminopropyl)tetramethyldisiloxane were added together with 250 g of NMP, followed by a reaction at 80° C. for 3 hours. After completion of the reaction, the solution was cooled to room temperature and the solution was poured into 10 L of water to obtain a white precipitate. This precipitate was collected by filtration, washed three times with water, and then dried by a vacuum dryer at 80° C. for 40 hours to obtain a polyimide precursor (A-3) in which a ratio of a structural unit represented by the general formula (1) to a structural unit represented by the general formula (2) is 68:32, and an imidization ratio is 33%.

Synthesis Example 5

Synthesis of Resin (A-4)

Under a current of dry nitrogen, 62.0 g (0.2 mol) of ODPA was dissolved in 1,000 g of NMP. To the solution, 73.1 g (0.2 mol) of BAHF was added together with 250 g of NMP, followed by a reaction at 60° C. for one hour and further reaction at 200° C. for 6 hours. After completion of the reaction, the solution was cooled to room temperature and the solution was poured into 10 L of water to obtain a white precipitate. This precipitate was collected by filtration, washed three times with water, and then dried by a vacuum dryer at 80° C. for 40 hours to obtain a polyimide resin (A-4) having an imidization ratio of 98%. In the polyimide resin (A-4), a ratio of a structural unit represented by the general formula (1) to a structural unit represented by the general formula (2) is 100:0.

Synthesis Example 6

Synthesis of Resin (A-5)

Under a current of dry nitrogen, 62.0 g (0.2 mol) of ODPA was dissolved in 1,000 g of NMP. To the solution, 36.5 g (0.10 mol) of BAHF and 48.0 g (0.08 mol) of JEFFAMINE (registered trademark) ED-600, which is diamine containing ethylene glycol and propylene glycol, were added together with 200 g of NMP, and 4.4 g (0.04 mol) of 3-aminophenol was added together with 50 g of NMP, followed by a reaction at 60° C. for one hour and further reaction at 180° C. for 8 hours. After completion of the reaction, the solution was cooled to room temperature and the solution was poured into 10 L of water to obtain a white precipitate. This precipitate was collected by filtration, washed three times with water, and then dried by a vacuum dryer at 40° C. for 48 hours to obtain a polyimide resin (A-5) which is the objective resin. A ratio of a structural unit represented by the general formula (1) to a structural unit represented by the general formula (2) was 56:44, and an imidization ratio was 98%.

Synthesis Example 7

Synthesis of Benzoxazine Compound (C)

In a flask, 100 g of 1,4-dioxane and 0.2 mol of 37% formalin were charged and 0.1 mol of aniline was added dropwise while stirring. Furthermore, 0.1 mol of a 1,4-dioxane solution of phenol novolak was added dropwise, similarly. After completion of the dropwise addition, the reaction was continued at 80° C. for 4 hours. Thereafter, vacuum dehydration was performed to obtain a phenol novolak type dihydrobenzoxazine compound (C).

The following compounds were also used as the thermally crosslinkable compound (c).
Compound having a benzoxazine structure: B-m type benzoxazine (trade name, manufactured by SHIKOKU CHEMICALS CORPORATION) Compound having an epoxy structure: EPICLON (registered trademark) EXA-4880 (trade name, manufactured by Dainippon Ink and Chemicals, Inc.)
Compound having an alkoxymethyl group: HMOM-TPHAP (trade name, manufactured by Honshu Chemical Industry Co., Ltd.).

Example 1

The resin (A-1) (100 parts by weight) obtained in the above Synthesis Example, 20 parts by weight of (B), 10 parts by weight of B-m type benzoxazine as the component (c), and 140 parts by weight of gamma-butyrolactone as the solvent were added to prepare a varnish, and then the varnish was evaluated by the above method.

Example 2

In the same manner as in Example 1, except that (A-2) was used in place of (A-1) used in Example 1, a varnish was prepared and then evaluated by the above method.

Example 3

The resin (A-1) (100 parts by weight) obtained in the above Synthesis Example, 25 parts by weight of (B), 30 parts by weight of (C) as the component (c), 10 parts by weight HMOM-TPHAP, and 140 parts by weight of gamma-butyrolactone as the solvent were added to prepare a varnish, and then the varnish was evaluated by the above method.

Example 4

The resin (A-1) (100 parts by weight) obtained in the above Synthesis Example, 25 parts by weight of (B), 10 parts by weight of B-m type benzoxazine as the component (c), 10 parts by weight of HMOM-TPHAP, 30 parts by weight of EPICLON EXA-4880, and 170 parts by weight of gamma-butyrolactone as the solvent were added to prepare a varnish, and then the varnish was evaluated by the above method.

Example 5

The resin (A-2) (100 parts by weight) obtained in the above Synthesis Example, 25 parts by weight of (B), 30 parts by weight of (C) as the component (c), 10 parts by weight of HMOM-TPHAP, 30 parts by weight of EPICLON EXA-4880, and 170 parts by weight of gamma-butyrolactone as the solvent were added to prepare a varnish, and then the varnish was evaluated by the above method.

Example 6

The resin (A-2) (100 parts by weight) obtained in the above Synthesis Example, 25 parts by weight of (B), 10 parts by weight of HMOM-TPHAP as the component (c), 30 parts by weight of EPICLON EXA-4880, and 170 parts by weight of gamma-butyrolactone as the solvent were added to prepare a varnish, and then the varnish was evaluated by the above method.

Example 7

The resin (A-1) (100 parts by weight) obtained in the above Synthesis Example, 20 parts by weight of (B), and 140 parts by weight of gamma-butyrolactone as the solvent were added to prepare a varnish, and then the varnish was evaluated by the above method.

Example 8

The resin (A-5) (100 parts by weight) obtained in the above Synthesis Example, 25 parts by weight of (B), 30 parts by weight of (C) as the component (c), 10 parts by weight of HMOM-TPHAP, and 140 parts by weight of gamma-butyrolactone as the solvent were added to prepare a varnish, and then the varnish was evaluated by the above method.

Comparative Example 1

In the same manner as in Example 1, except that (A-3) was used in place of (A-1) used in Example 1, a varnish was prepared and then evaluated by the above method.

Comparative Example 2

In the same manner as in Example 1, except that (A-4) was used in place of (A-1) used in Example 1, a varnish was prepared and then evaluated by the above method.

The compositions of the above evaluation varnishes are shown in Table 1.

TABLE 1

| | (a) Polyimide resin | (b) Quinonediazide compound | (c) Thermally crosslinkable compound | | | Solvent |
|---|---|---|---|---|---|---|
| | Additive amount | Additive amount | Additive amount | Additive amount | Additive amount | |
| Example 1 | A-1 100 Parts by weight | B 20 Parts by weight | B-m type benzoxadine 10 Parts by weight | | | γ-Butyrolactone |
| Example 2 | A-2 100 Parts by weight | B 20 Parts by weight | B-m type benzoxadine 10 Parts by weight | | | γ-Butyrolactone |
| Example 3 | A-1 100 Parts by weight | B 25 Parts by weight | C 30 Parts by weight | HMOM-TPHAP 10 Parts by weight | | γ-Butyrolactone |
| Example 4 | A-1 100 Parts by weight | B 25 Parts by weight | B-m type benzoxadine 10 Parts by weight | HMOM-TPHAP 10 Parts by weight | EPICLON EXA-4880 30 Parts by weight | γ-Butyrolactone |
| Example 5 | A-2 100 Parts by weight | B 25 Parts by weight | C 30 Parts by weight | HMOM-TPHAP 10 Parts by weight | EPICLON EXA-4880 30 Parts by weight | γ-Butyrolactone |
| Example 6 | A-2 100 Parts by weight | B 25 Parts by weight | HMOM-TPHAP 10 Parts by weight | EPICLON EXA-4880 30 Parts by weight | | γ-Butyrolactone |
| Example 7 | A-1 100 Parts by weight | B 20 Parts by weight | | | | γ-Butyrolactone |
| Example 8 | A-5 100 Parts by weight | B 25 Parts by weight | C 30 Parts by weight | HMOM-TPHAP 10 Parts by weight | | γ-Butyrolactone |
| Comparative Example 1 | A-3 100 Parts by weight | B 20 Parts by weight | B-m type benzooxadine 10 Parts by weight | | | γ-Butyrolactone |
| Comparative Example 2 | A-4 100 Parts by weight | B 20 Parts by weight | B-m type benzooxadine 10 Parts by weight | | | γ-Butyrolactone |

The above evaluation results are shown in Table 2.

TABLE 2

| | Evaluation of sensitivity | | Evaluation of resolution | | Measurement of warpage | |
|---|---|---|---|---|---|---|
| | Sensitivity (mJ/cm$^2$) | Evaluation | Minimum dimension resolved (μm) | Evaluation | Stress (MPa) | Evaluation |
| Example 1 | 200 | A | 3 | A | 17 | A |
| Example 2 | 210 | A | 3 | A | 13 | A |
| Example 3 | 210 | A | 2 | A | 22 | B |
| Example 4 | 290 | A | 3 | A | 21 | B |
| Example 5 | 280 | A | 4 | A | 26 | B |
| Example 6 | 420 | B | 4 | A | 29 | B |
| Example 7 | 390 | B | 5 | B | 13 | A |
| Example 8 | 210 | A | 5 | B | 13 | A |
| Comparative Example 1 | No pattern remains | — | No pattern remains | — | 35 | D |
| Comparative Example 2 | 780 | C | 9 | B | 30 | C |

The invention claimed is:

1. A positive-type photosensitive resin composition comprising:
(a) a polyimide resin including a structural unit represented by the general formula (1) and a structural unit represented by the general formula (2), and
(b) a quinonediazide compound,
wherein the polyimide resin (a) including a structural unit represented by the general formula (1) and a structural unit represented by the general formula (2) has an imidization ratio of 85% or more, and also a ratio of the structural unit represented by the general formula (1) to the structural unit represented by the general formula (2) is within a range of 30:70 to 90:10:

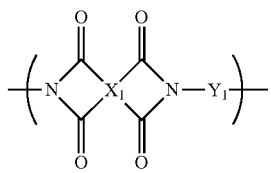

(1)

wherein $X_1$ in the general formula (1) represents a tetracarboxylic acid residue including 1 to 4 aromatic rings, and $Y_1$ represents an aromatic diamine residue including 1 to 4 aromatic rings; and

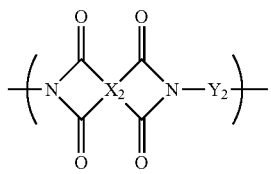

(2)

wherein $X_2$ in the general formula (2) represents a tetracarboxylic acid residue including 1 to 4 aromatic rings, and $Y_2$ represents a diamine residue including at least two or more alkylene glycol units in the main chain;

wherein the diamine residue including at least two or more alkylene glycol units in the main chain represented by $Y_2$ in the general formula (2) is a diamine residue having a structure represented by the general formula (3):

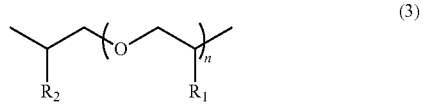

(3)

wherein $R_1$ and $R_2$ in the general formula (3) represent a hydrogen atom or an alkyl group having 1 to 20 carbon atoms, a plurality of $R_1$(s) in the same residue may be the same or different, and n represents an integer of 2 to 50.

2. The positive-type photosensitive resin composition according to claim 1, further comprising (c) a thermally crosslinkable compound.

3. The positive-type photosensitive resin composition according to claim 2, wherein the thermally crosslinkable compound (c) is a compound having a benzoxazine structure.

4. A method for producing a semiconductor device, which comprises applying the photosensitive resin composition according to claim 1 on a substrate, followed by heating to form a cured film.

* * * * *